(12) United States Patent
Lindsey

(10) Patent No.: US 7,142,083 B2
(45) Date of Patent: Nov. 28, 2006

(54) ELECTRONICS COMPONENT AND METHOD FOR FABRICATING SAME

(76) Inventor: Raymond A. Lindsey, 334 Oak Grove Rd., Vassalboro, ME (US) 04989

( * ) Notice: Subject to any disclaimer, the term of this patent is extended or adjusted under 35 U.S.C. 154(b) by 57 days.

(21) Appl. No.: 10/245,214

(22) Filed: Sep. 17, 2002

(65) Prior Publication Data

US 2004/0051618 A1    Mar. 18, 2004

(51) Int. Cl.
 *H01F 5/00*     (2006.01)
 *H01F 27/29*    (2006.01)
(52) U.S. Cl. ....................... 336/192; 336/200
(58) Field of Classification Search ............... 336/192, 336/96, 90, 65, 229, 200, 223, 83
See application file for complete search history.

(56) References Cited

U.S. PATENT DOCUMENTS

| | | | |
|---|---|---|---|
| 4,495,480 A | | 1/1985 | Martin et al. |
| 4,975,312 A | | 12/1990 | Lusignea et al. |
| 5,034,854 A | * | 7/1991 | Matsumura et al. ........ 361/744 |
| 5,212,345 A | * | 5/1993 | Gutierrez ................. 174/52.5 |
| 5,609,491 A | | 3/1997 | Cooper et al. |
| 5,650,920 A | * | 7/1997 | Pfizenmayer ............... 361/782 |
| 5,712,764 A | | 1/1998 | Baker et al. |
| 5,909,839 A | | 6/1999 | Belke, Jr. et al. |
| 6,243,164 B1 | | 6/2001 | Baldwin et al. |
| 6,297,721 B1 | * | 10/2001 | Lu et al. ...................... 336/96 |
| 6,371,817 B1 | | 4/2002 | Shi et al. |
| 6,403,211 B1 | | 6/2002 | Yang et al. |
| 6,642,827 B1 | * | 11/2003 | McWilliams et al. ....... 336/107 |
| 2002/0028293 A1 | | 3/2002 | Yang et al. |

OTHER PUBLICATIONS

Yang, "Liquid Crystal Polymers", in Advanced Packaging, Mar. 2002.
Bogatin, "Liquid Crystal Polymers and Packaging", in Semiconductor International, Jul. 1, 2002.
Technical Data Sheet: Hysol QMI 527 Conductive Adhesive, Loctite Corporation, Rocky Hill, CT.

* cited by examiner

*Primary Examiner*—Anh Mai

(57) ABSTRACT

An electronic component for mounting on a mating component. The electronic component includes a case and a plurality of electrical contacts. The case is fabricated from an electrically insulative material, such as a liquid crystal polymer material, and is sized and shaped to support or house an electronic device. The case includes at least one engagement surface sized and shaped for engaging a mating component and the electrical contacts include an electrically conductive layer deposited on the engagement surface.

32 Claims, 9 Drawing Sheets

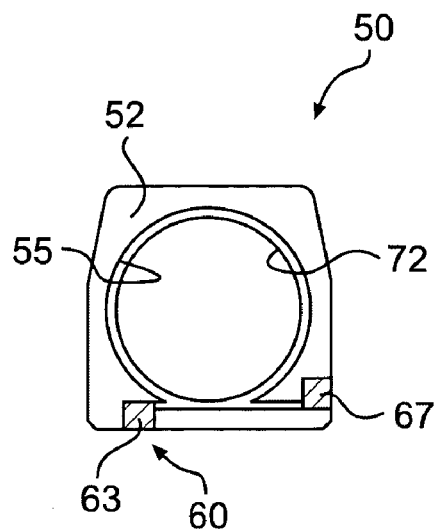
FIG. 8A
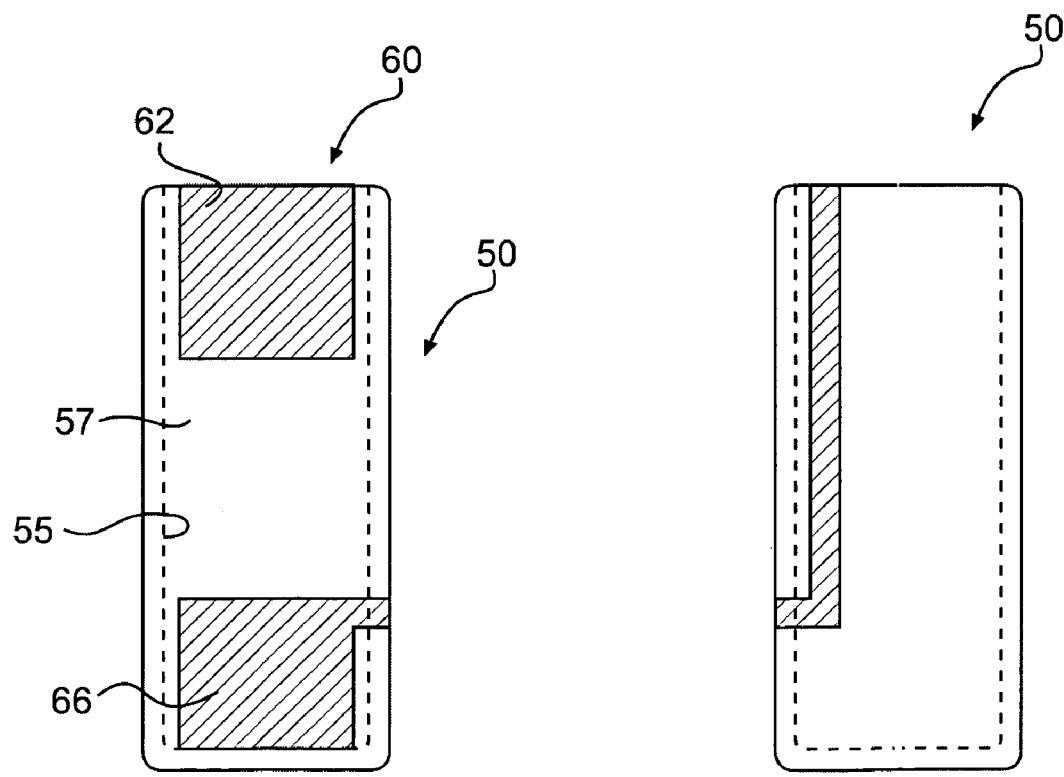
FIG. 8B          FIG. 8C

ELECTRONICS COMPONENT AND METHOD FOR FABRICATING SAME

BACKGROUND OF THE INVENTION (1) Field of the Invention

The present invention relates generally to electronic components used in circuit board assemblies. This invention more particularly relates to electrical connectors used to establish an electrical connection between the electronic components and the mating component (e.g., circuit board) wiring.

(2) Background Information

The electronics industry is continually decreasing the size of electronic components while increasing the pin count thereof in an effort to increase the density of electronic packaging. As a result, the conventional practice for coupling leads to electronic components for use in circuit boards has gradually transitioned from through-hole technology to surface mount technology.

In through-hole technology the leads are deployed to protrude from the top and/or bottom major surfaces of the package with the leads being oriented in a direction substantially normal to the plane thereof (i.e., normal to the plane of the mating component). These leads are then inserted through corresponding holes in the mating component for mechanical and electrical attachment by soldering.

In surface mount technology the leads are typically deployed about the periphery of the electronic component in a plane substantially parallel to the package, with the distal portions thereof offset from the plane of the package. The distal portions of the leads are then positioned on corresponding pads on the mating components for soldering. Surface mount technology tends to allow for closer spacing of the leads in X and Y directions (e.g., in the plane of a circuit board), a reduction in size of the overall package, and the placement of electronic components on both sides of a mating component.

For proper mounting on a circuit board it is typically necessary that the leads of surface mountable electronic components be correctly positioned and that the engagement surfaces (i.e., the distal ends) thereof lie in a substantially common plane, a property known in the art as lead coplanarity. However, in practice, in part owing to the increasingly tight tolerances, a significant percentage of electronic components fail to meet coplanarity requirements. For example, a defective or noncoplanar lead may exhibit a property known in the art as lead standoff, a defect characterized by a lead that sits too high above the mating component for a reliable solder connection to be made between the lead and a corresponding copper pad thereon. Defective leads may also be bent sideways, out, in or down moving the end of the pin from a plane common with the ends of the other pins.

Further, as the pin count increases and lead spacing decreases, other mechanical parameters of the component leads, such as lead pitch, missing leads, lead deformation and the like, also tend to be important for ensuring proper electrical interconnections when the electronic components are mounted on a mating component.

Therefore, there exists a need for improved electronic components and in particular a method for fabricating electrical connectors therefor that may be suitable for next generation technology.

SUMMARY OF THE INVENTION

One aspect of the present invention includes an electronic component for mounting on a mating component. The electronic component includes a case and a plurality of electrical contacts. The case is fabricated from an electrically insulative material and is sized and shaped to support or house an electronic device. The case includes at least one engagement surface sized and shaped for engaging a mating component and the electrical contacts include an electrically conductive layer deposited on the engagement surface.

In another aspect, this invention includes an electronic component fabricated by the process of molding a case having a plurality of contact members integral therewith and extending therefrom and selectively depositing a plurality of electrically conductive contact layers on the plurality of contact members. The case is molded from an electrically insulative thermoplastic material and is sized and shaped to support or house an electronic device. The plurality of contact members includes a plurality of engagement surfaces sized and shaped for engaging a mating component. The contact layers are deposited using a process selected from the group consisting of electrodeposition, electroless deposition, chemical vapor deposition, and sputter deposition.

In yet another aspect, this invention includes a method for fabricating an electronic component. The method includes molding a case from an electrically insulative material sized and shaped to support or house an electronic device and including at least one engagement surface sized and shaped for engaging a mating component and selectively depositing a plurality of electrically conductive contact layers on the engagement surface.

In still another embodiment, this invention includes an electronic assembly. The electronic assembly includes a mating component including a plurality of electronic devices mounted thereon and electrically conductive paths interconnecting at least two of said plurality of devices. The mating component has a substantially non-planar geometry and includes a plurality of electrical contact pads for mounting an electronic component thereto, the plurality of contact pads defining a curved surface. The electronic assembly further includes an electronic component including a case and a plurality of electrical contacts. The case may be molded from an electrically insulative material, such as a liquid crystal polymer material, and includes a plurality of contact members integral therewith and extending therefrom. The plurality of contact members includes a plurality of engagement surfaces sized and shaped for engaging the plurality of contact pads and the plurality of engagement surfaces defines a surface substantially conformal with the curved surface defined by the contact pads. The electronic component is mounted on the mating component with the plurality of engagement surfaces being in surface-to-surface engagement with the plurality of contact pads.

BRIEF DESCRIPTION OF THE DRAWINGS

FIG. 8 is a schematic representation of yet a further embodiment of this invention.

DETAILED DESCRIPTION

Figure 1:
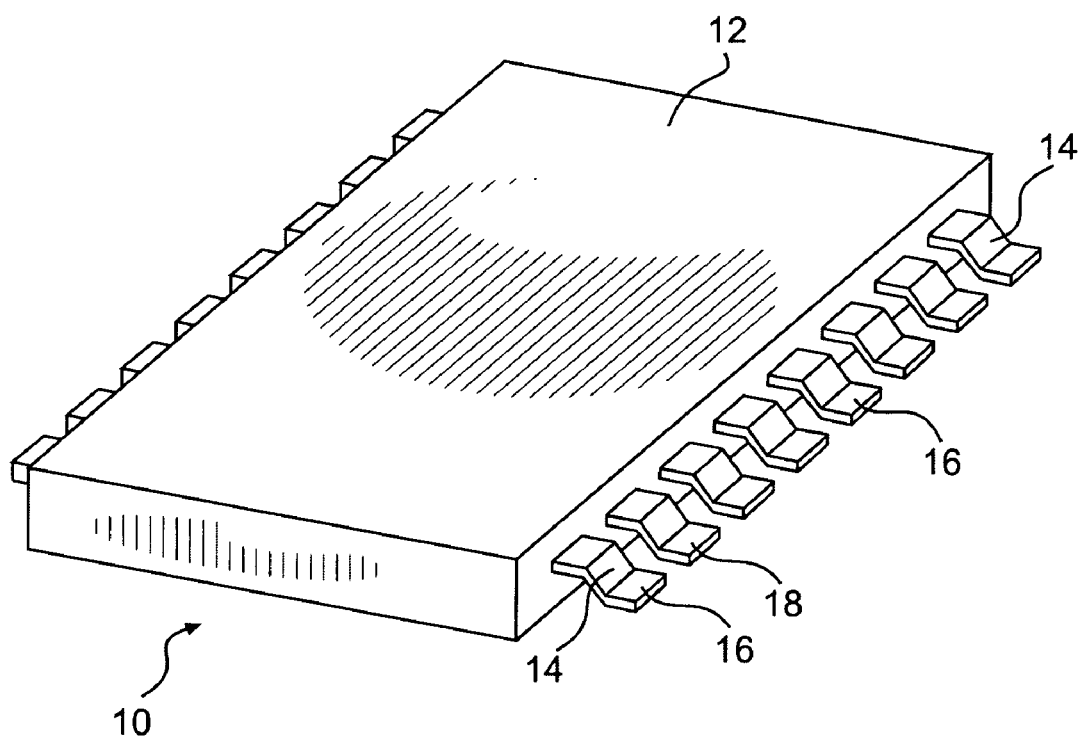
FIG. 1 is a schematic representation of a prior art electronic component including a noncoplanar lead.

In the following detailed description, reference is made to the accompanying drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural and system changes may be made without departing from the spirit and scope of the present invention. The following detailed description is, therefore, not to be taken in a limiting sense, and the scope of the present invention is defined by the appended claims and their equivalents. For clarity of exposition, like features shown in the accompanying drawings shall be indicated with like reference numerals and similar features as shown in alternate embodiments in the drawings shall be indicated with similar reference numerals.

Referring briefly to the accompanying figures, the present invention is directed to an electronic component that may meet the demands of present and next generation electronic components and circuit board assemblies. The component may be well suited for surface mount technology applications having relatively stringent coplanarity requirements. In one embodiment, this invention includes an electronic component 20, e.g., a surface mount transformer package, including a case 22 having a plurality of contact members 26 integral therewith. The contact members 26 are typically coated with a relatively thin metallic contact layer 30, e.g., copper, phosphorus bronze, or other conductive materials, for providing electrical contact between the device and a mating component. As used herein the term "mating component" refers to the component to which the electronic component of this invention is mated. One exemplary mating component includes a circuit board.

The present invention advantageously provides for electronic components that may meet the stringent demands of next generation applications, and in particular coplanarity requirements for surface mount technology. Further, this invention tends to provide for robust and reliable lead fabrication. This invention also advantageously tends to reduce manufacturing complexity and hence provides for a relatively inexpensive method of fabricating electronic components. These and other advantages of this invention will become evident in light of the following discussion of various embodiments thereof.

Referring now to FIG. 1, a prior art electronic component 10 employing surface mount technology is illustrated. Component 10 includes a case 12 with a plurality of leads 14 coupled thereto. In one typical fabrication procedure, case 12 is fabricated using a conventional injection molding process and includes a plurality of holes or slots (not shown) for inserting the leads 14 therein. The leads are typically stamped from a thin metallic (e.g., copper, phosphorus bronze, and other conductive materials) sheet and then bent to an appropriate shape in a later operation. In an alternate fabrication procedure, typically used for semiconductors, the leads 14 are first electrically coupled to the device. The chip is then encapsulated in a thermosetting or epoxy resin material using a transfer molding process. After fabrication, the components 10 are typically tested to ensure that the leads are correctly positioned and that the distal ends 16 thereof reside in a common plane. For example, in some applications the distal ends 16 of the leads 14 are specified to be coplanar within a tolerance of about 0.1 millimeter (0.004 inches). Components 10 including one or more leads (e.g., lead 18) that are out of specification are typically scrapped.

Meeting coplanarity requirements is a significant issue for the electronics industry. For some applications up to 20 percent or more of the fabricated components are scrapped owing to a failure to meet coplanarity specifications. Additional losses may be caused by damage occurring during shipping and handling. For example, during a typical shipping and handling procedure, the components are packaged several hundred to a bag, with up to 20 or more bags stacked in a box. Conventional components, such as those shown in FIG. 1, in which the leads are inserted into holes or slots in the case, tend not to be robust to the mechanical agitation associated with such shipping and handling procedures. As a result, additional losses resulting from failure to meet coplanarity specifications are often observed after shipping the components to an end manufacturer.

Figure 2A:
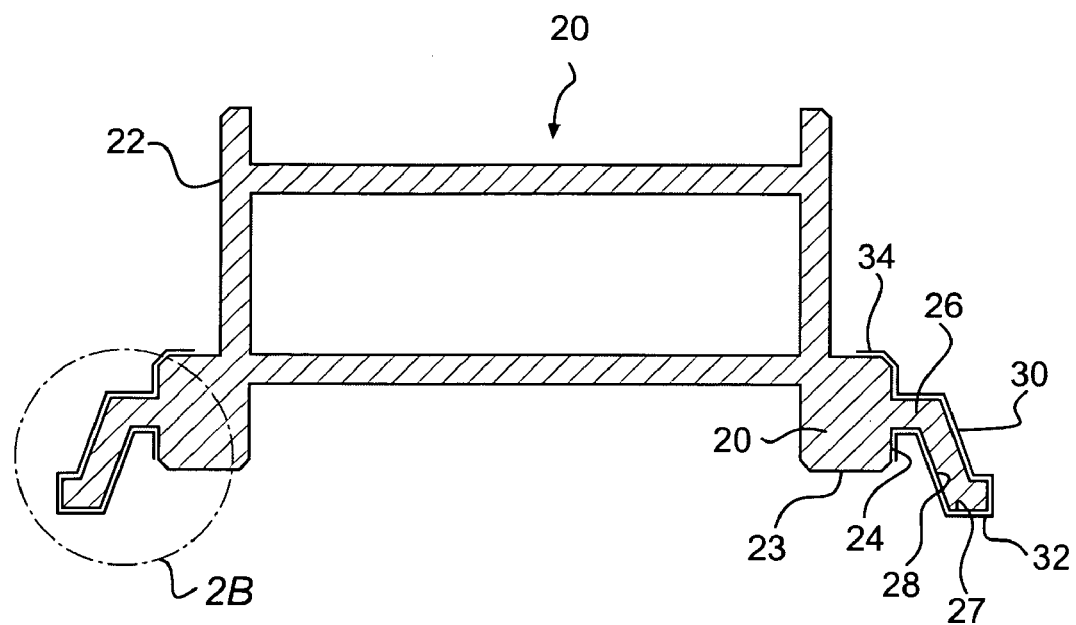
FIG. 2A is a cross sectional schematic representation of one embodiment of an electronic component according to the principles of the present invention.
Figure 2B:
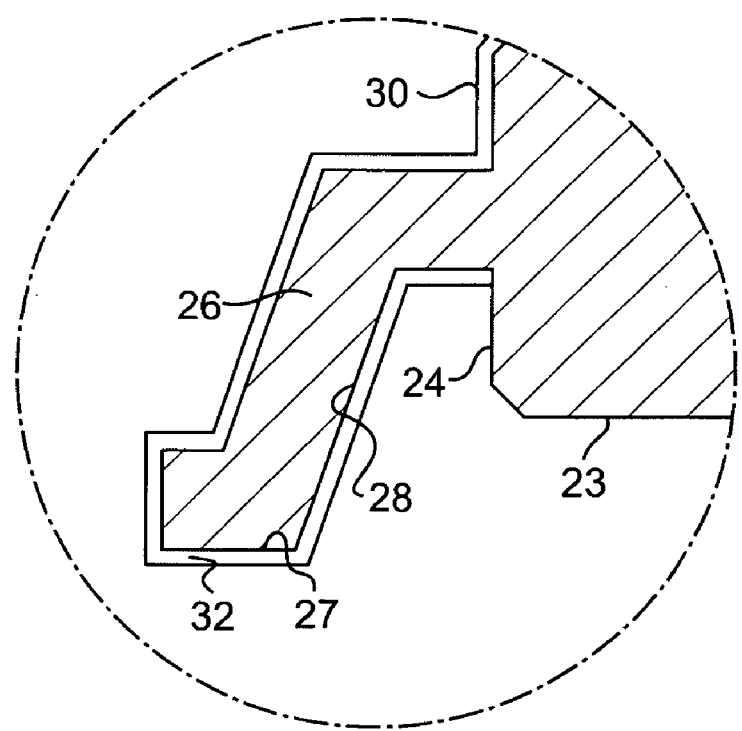
FIG. 2B is a cross sectional schematic representation of a portion of the electronic component of FIG. 2A.
Figure 3:
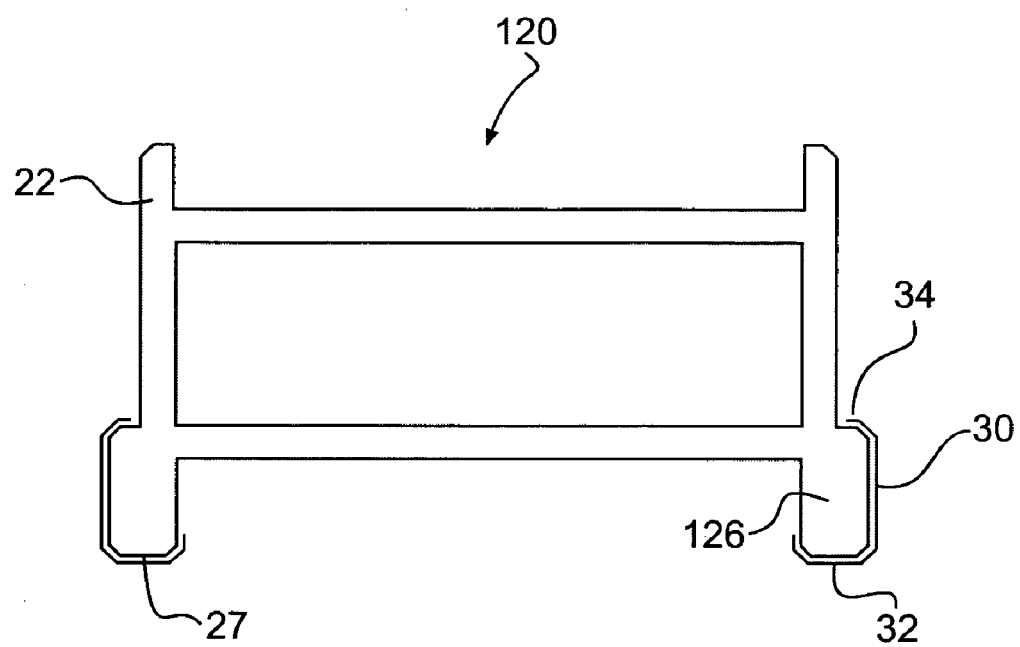
FIG. 3 is a cross sectional schematic representation of another embodiment of this invention.
Figure 4:
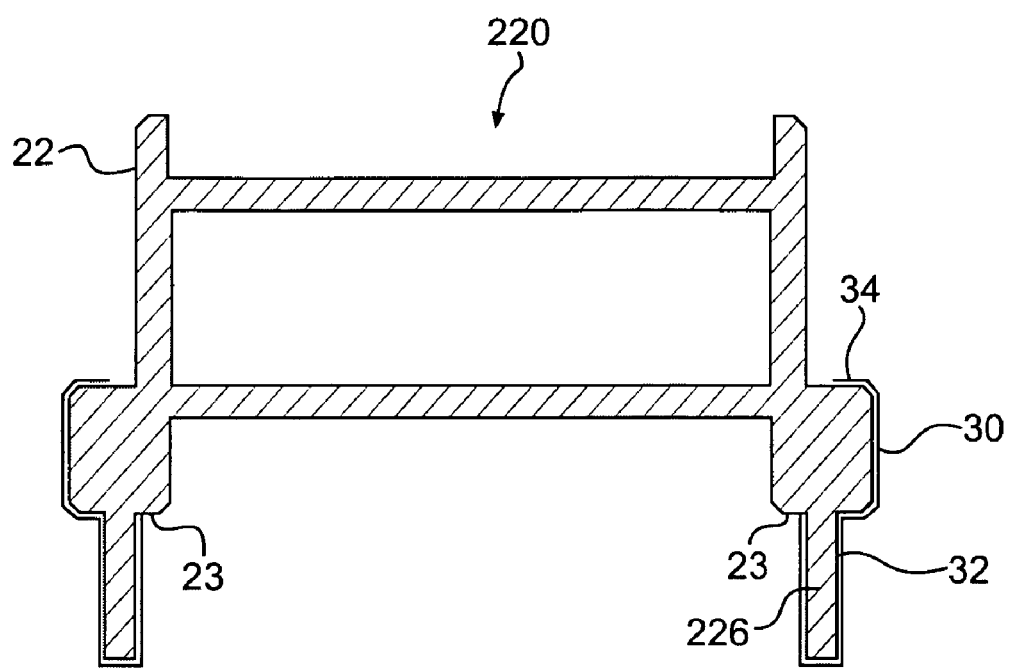
FIG. 4 is a cross sectional schematic representation of yet another embodiment of this invention.
Figure 5:
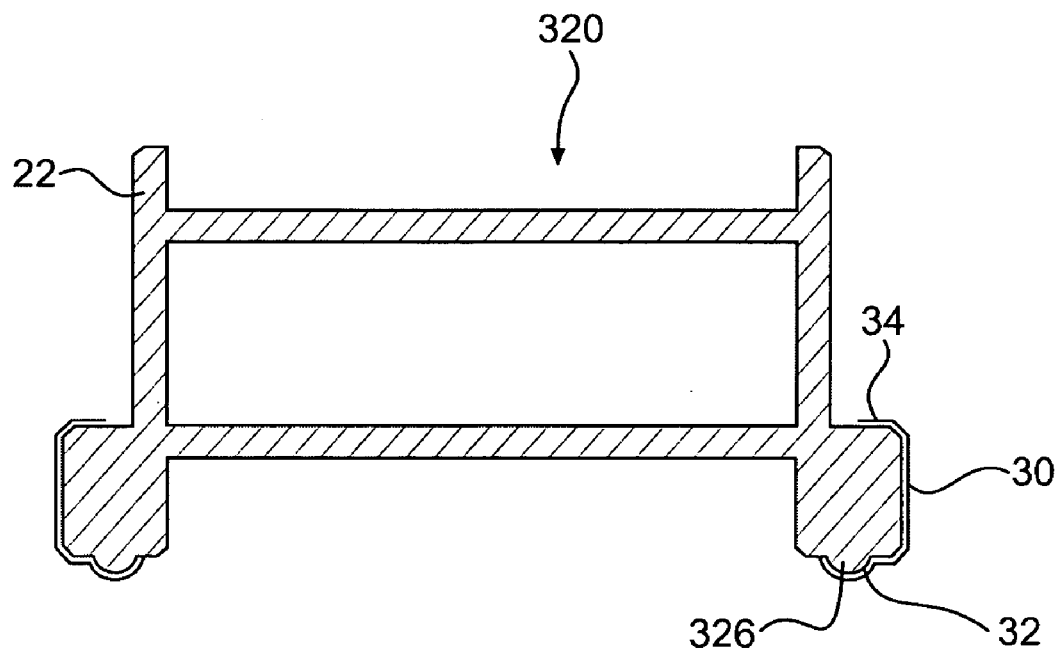
FIG. 5 is a cross sectional schematic representation of still another embodiment of this invention.
Figure 6:
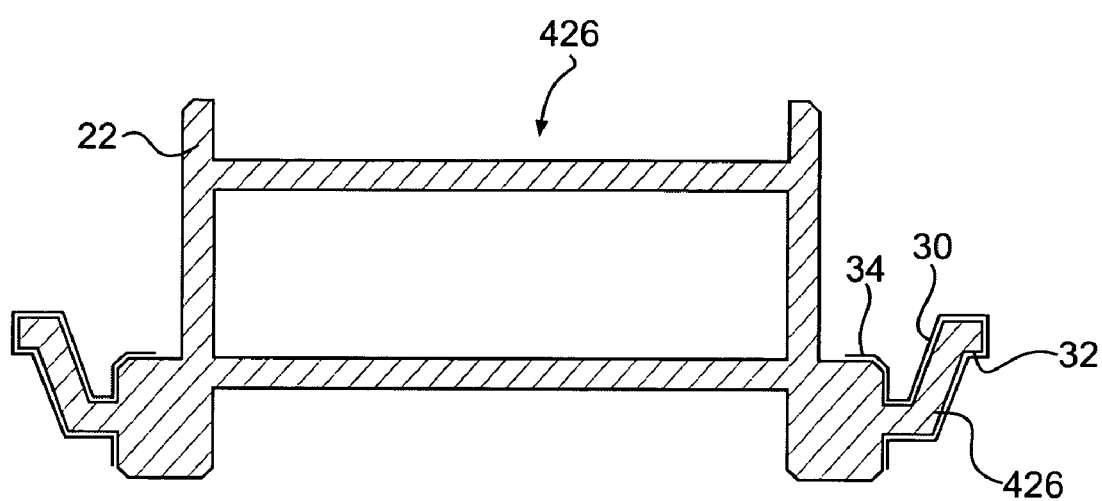
FIG. 6 is cross sectional schematic representation of a further embodiment of this invention.

Referring now to FIGS. 2A and 2B, one embodiment of an electronic component 20 of the present invention is illustrated. Electronic component 20 includes a transformer for use on a circuit board (or some other mating component). The artisan of ordinary skill will readily recognize that while the illustrated component includes a transformer, this invention may include substantially any type of electronic component. For example this invention may include semiconductors, interconnects, passives (e.g., including transformer coils, potentiometers, fuses, breakers, and the like), electro-mechanicals, power, and specialty components, and boards. As described briefly hereinabove, component 20 includes a case 22 having a plurality of contact members 26 integral therewith and extending from a peripheral surface 24 thereof. Case 22 serves to support or house (depending on the component type) the electronic device (e.g., semiconductor chip, transformer winding, or coil). For example, in the embodiment shown, case 22 supports a transformer winding (not shown) wound thereabout. Accordingly, case 22 functions as support means for an electronic device.

Case 22 may be fabricated from substantially any insulating material such as ceramic and/or plastic materials. Plastic materials typically provide for significantly lower cost fabrication (e.g., by utilizing relatively low cost injection molding technology) and are therefore typically preferable to ceramic materials. Plastic materials having an upper use temperature greater than about 250 degrees C. tend to be desirable materials for fabricating the case 22, with plastics having an upper use temperature greater than about 285 degrees C. being most desirable. In particular, many liquid crystal polymer materials, such as Zenite® 7000 Series provided by E. I. du Pont de Nemours and Company (Wilmington, Del.), have relatively high upper use temperatures (greater than about 250 degrees C.) and are desirable for embodiments of this invention. As used herein, the term "upper use temperature" refers to a maximum temperature at which the material may be used. The artisan of ordinary skill will readily recognize that the liquid crystal polymer and other plastic materials used in this invention are thermoplastic materials and hence tend to soften at elevated temperatures. At temperatures above the upper use temperature, the mechanical integrity (e.g., strength and hardness) of the material is generally no longer sufficient for use in the electronic component of this invention. A relatively high upper use temperature (i.e., greater than about 250 degrees C.) is desirable in that it enables the component to be soldered to a mating component without damaging (e.g., bending or warping) or stressing the contact members.

Case 22, including integral contact members 26, is typically fabricated in a single molding operation enabling the contact members 26 to be accurately and repeatedly (from part to part) positioned. As such, the component may be fabricated to include contact members 26 having engagement surfaces 27 that meet particularly closely toleranced coplanarity specifications and thus may provide for substantially stress free engagement with a mating component. Accordingly, engagement surfaces 27 function as engagement means for engaging the electronic component with a mating component. For example in one embodiment the engagement surfaces 27 may be specified to be coplanar within a tolerance of about 0.25 millimeter (0.01 inch). In another embodiment, the engagement surfaces 27 may be specified to be coplanar within a tolerance of about 0.1 millimeter (0.004 inch). Further, case 22 may be fabricated to include substantially any number of contact members 26, but typically includes from about 6 to about 40.

After molding the case 22 (and the associated contact members 26), electrical contact layers 30, typically of metallic composition, are selectively deposited on at least one of the contact members 26. Contact layers effectively function as contact means for providing electrical connection with the mating component. The contact layers 30 include a proximal end 34 for providing an electrical connection to the device (not shown) and a distal end 32 for providing an electrical connection to a mating component (e.g., mating component 110 in FIG. 7). The artisan of ordinary skill will readily recognize that the contact layers 30 may be deposited over substantially all of the surface area 28 of the contact members 26 or merely a portion thereof. Embodiments in which the contact layers 30 cover most, if not substantially all, of the surface area 28 of the contact members 26 are generally desirable in that they tend to provide a greater contact area and therefore a more reliable electrical contact with a mating component.

The electrical contact layers 30 are typically metallic films such as copper or phosphorus bronze and may be deposited using substantially any deposition technique including but not limited to electrodeposition, electroless deposition, chemical vapor deposition, and sputter deposition. In a generally desirable embodiment electrical contact layers 30 are sputter deposited over selected areas of the case 22 (e.g., using conventional masking and sputter deposition techniques). In an alternate embodiment, electrical contact layers 30 including conductive adhesives, such as Hysol® QMI 527 available from Loctite® Corporation (Rocky Hill, Conn.), may be used.

Referring now to FIGS. 3–6, alternate embodiments 120, 220, 320, and 420 of the electronic component of this invention are illustrated. Embodiments 120, 220, 320, and 420 are similar to electronic component 20 in that they include a transformer having a case 22-including a plurality of contact members 126, 226, 326, and 426 integral therewith. Embodiments 120 and 220 are similar to that of embodiment 20. Embodiment 120, like embodiment 20, is configured for surface mount technology, however, it includes a relatively smaller footprint than that of embodiment 20 and may therefore be desirable in applications in which relatively small components are preferred. Embodiment 220 is configured for through-hole technology and thus contact member 226 extends downward (i.e., in a substantially orthogonal direction to a mating component (e.g., a circuit board)) from a bottom surface 23 thereof. Embodiment 320 is substantially identical to that of embodiment 20 with the exception that contact members 326 are substantially hemispherical protrusions. Thus embodiment 320 may be well suited for applications in which ball grid arrays are desirable. Embodiment 420 is substantially identical to that of embodiment 20 with the exception that it is configured as a 'gull-wing' device, i.e., it is configured to be suspended in (or over) an opening in a mating component (not shown). Hence, the contact members 426 extend generally upwards. Embodiment 420 may be desirable in applications in which 'gull-wing' devices are utilized. The artisan or ordinary skill will readily recognize that substantially any number of contact configurations may be utilized in the electronic component of this invention. The configurations in embodiments 20, 120, 220, 320, and 420 are merely illustrative of exemplary configurations and are not intended in any way to represent an exhaustive list of potential embodiments.

As described briefly hereinabove, this invention is advantageous in that it provides for an electronic component having precisely positioned contact members (since the position of the contact members is determined by the shape of the mold used during fabrication thereof) having a predetermined geometry for surface-to-surface engagement with a mating component. As described above, the component may be fabricated to meet substantially any coplanarity requirement. Moreover, the component may be fabricated for surface-to-surface engagement with a mating component including a non-planar geometry of substantially any predetermined shape. For many applications it may be desirable, or even advantageous, to utilize non-planar mating components. Exemplary applications may include pacemakers that may be shaped to substantially conform to a patient's rib or ribcage or an automotive device that may be shaped to substantially conform to a portion of a dashboard.

Figure 7:
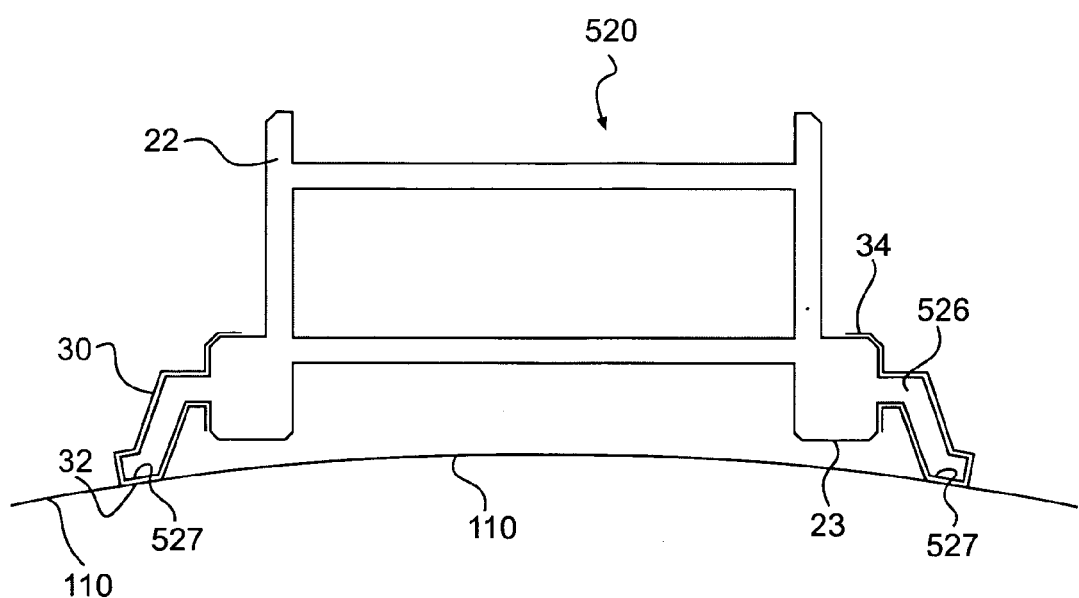
FIG. 7 is a cross sectional schematic representation of still a further embodiment of this invention in surface to surface engagement with a non-planar mating component.

Referring now to FIG. 7, another alternate embodiment 520 of the electronic component of this invention is illustrated shown in surface-to-surface engagement with a mating component 110 having a non-planar geometry. Embodiment 520 is substantially identical to that of embodiment 20 (FIG. 2A) with the exception that it is configured for surface mounting to a non-planar mating component 110. As such the engagement surfaces 527 of contact members 526 define a shape substantially conformal with that of a predetermined mounting location on mating component 110 and may provide for substantially stress free engagement therewith. In the exemplary embodiment shown, mating component 110 includes a plurality of electrical contact pads 540 for mounting an electronic component thereto (e.g., component 520). Mating component 110 further includes a plurality of electronic devices 550 mounted thereon and electrically conductive paths 560 interconnecting at least two of the electronic devices 550. The artisan of ordinary skill will readily recognize that embodiments of this invention may be sized and shaped for surface mounting to mating components having substantially any geometry.

While in embodiments 20, 120, 220, 320, 420, and 520 (FIGS. 2A–7) the contact layer(s) 30 are selectively deposited on contact members 26, 126, 226, 326, 426, and 526, respectively, that extend outward from the case 22, the artisan of ordinary skill will readily recognize that the contact layer(s) may be deposited directly on the case 22. Referring now to FIG. 8, an alternate embodiment 50 of this invention is illustrated. Embodiment 50 is a coil case for use in hearing aids (or other devices requiring relatively small coils) and includes a molded plastic case 52 having a substantially cylindrical bore 55 therein for housing a coil assembly (not shown). The engagement surface 57 (i.e., the side mountable to a mating component) of case 52 includes at least two electrical contact layers 60 selectively deposited directly thereon. As described hereinabove with respect to embodiment 20, contact layers 60 include proximal ends 63 and 67 for providing electrical connection to the coil 72 (shown in phantom) and distal ends 62 and 66 for providing electrical connection to a mating component (not shown). Contact layers 60 typically include a metallic material, such as copper, phosphor bronze and other conductive materials including conductive adhesives, and may be selectively deposited using substantially any deposition technique, such as by electrodeposition, electroless deposition, sputter deposition, and chemical vapor deposition, as described hereinabove.

The modifications to the various aspects of the present invention described hereinabove are merely exemplary. It is understood that other modifications to the illustrative embodiments will readily occur to persons with ordinary skill in the art. All such modifications and variations are deemed to be within the scope and spirit of the present invention as defined by the accompanying claims.

What is claimed is:

1. An electronic component for mounting on a mating component, said electronic component comprising:
   a case including a plurality of contact members extending therefrom;
   a plurality of electrical contacts;
   said case and said plurality of contact members being molded from an electrically insulative liquid crystal polymer material and being of a unitary construction;
   said plurality of contact members including a plurality of engagement surfaces sized and shaped for engaging a mating component;
   said plurality of engagement surfaces having a topography that corresponds to that of the mating component; and
   said plurality of electrical contacts including a conductive layer directly deposited on said plurality of engagement surfaces.

2. An electronic component for mounting on a mating component, said electronic component comprising:
   a case;
   a plurality of electrical contacts;
   said case being fabricated from an electrically insulative material;
   said case being sized and shaped to support or house an electronic device;
   said case including at least one engagement surface formed thereon, said at least one engagement surface sized and shaped for engaging a mating component; and
   each of said plurality of electrical contacts including an electrically conductive layer directly deposited on said engagement surface.

3. The electronic component of claim 2 being selected from the group consisting of transformer coils, potentiometers, fuses, and breakers.

4. The electronic component of claim 2 wherein said at least one engagement surface is sized and shaped for surface mounting to the mating component.

5. The electronic component of claim 2 wherein said at least one engagement surface is sized and shaped for substantially stress free surface-to-surface engagement with the mating component.

6. The electronic component of claim 2 wherein said plurality of electrical contacts include:
   a proximal end for establishing an electrical connection with the electronic device; and
   a distal end for establishing an electrical connection with the mating component.

7. The electronic component of claim 6 wherein said distal end is disposed on said engagement surface.

8. The electronic component of claim 2 wherein said case comprises includes a bore for housing the electronic device.

9. The electronic component of claim 2 wherein said case comprises at least two electrical contacts directly deposited on a single engagement surface.

10. The electronic component of claim 2 comprising from about six to about forty electrical contacts.

11. The electronic component of claim 2 wherein said conductive layer is a metallic layer.

12. The electronic component of claim 2 wherein said conductive layer is selectively deposited directly on said at least one engagement surface by a process selected from the group consisting of electrodeposition, electroless deposition, sputter deposition, and chemical vapor deposition.

13. The electronic component of claim 2 wherein said case is fabricated from a material selected from the group consisting of ceramics and plastics.

14. The electronic component of claim 2 wherein said case is fabricated from a thermoplastic material.

15. The electronic component of claim 14 wherein said thermoplastic material comprises an upper use temperature of greater than about 250 degrees C.

16. The electronic component of claim 14 wherein said thermoplastic material comprises an upper use temperature of greater than about 285 degrees C.

17. The electronic component of claim 14 wherein said case and said at least one engagement surface are fabricated via a molding process.

18. The electronic component of claim 17 wherein said case is fabricated from a liquid crystal polymer material.

19. The electronic component of claim 2 wherein said case includes a plurality of contact members extending therefrom, said case and said plurality of contact members being of a unitary construction, each of said contact members including one of said engagement surfaces, said plurality of electrical contacts being disposed on said plurality of contact members.

20. The electronic component of claim 19 wherein each of said plurality of electrical contacts includes a distal end for establishing an electrical connection with the mating component, said distal end being disposed on one of said plurality of engagement surfaces.

21. The electronic component of claim 19 wherein each of said plurality of electrical contacts includes a proximal end for establishing an electrical connection with the electronic device, said proximal end being disposed on said case.

22. The electronic component of claim 19 wherein said plurality of engagement surfaces substantially defines a plane.

23. The electronic component of claim 22 wherein said plurality of engagement surfaces is coplanar within a tolerance of 0.25 millimeter.

24. The electronic component of claim 22 wherein said plurality of engagement surfaces is coplanar within a tolerance of 0.1 millimeter.

25. The electronic component of claim 19 wherein said plurality of engagement surfaces substantially defines a predetermined non-planer surface.

26. The electronic component of claim 25 wherein said plurality of engagement surfaces is sized and shaped for surface mounting to a non-planar mating component.

27. An electronic component for mounting on a mating component, said electronic component comprising:
a case;
a plurality of electrical contacts;
said case being fabricated from an electrically insulative material;
said case being sized and shaped to support or house an electronic device;
said case including at least one engagement surface formed thereon, said at least one engagement surface sized and shaped for engaging a mating component; and
each of said plurality of electrical contacts including an electrically conductive layer deposited on said engagement surface.

28. An electronic assembly comprising:
a mating component including a plurality of electronic devices mounted thereon and electrically conductive paths interconnecting at least two of said plurality of devices;
said mating component having a substantially non-planar geometry;
said mating component including a plurality of electrical contact pads for mounting an electronic component thereto, said plurality of contact pads defining a curved surface;
the electronic component including:
a case including a plurality of contact members extending therefrom;
a plurality of electrical contacts;
said case and said plurality of contact members being molded from an electrically insulative liquid crystal polymer material and being of a unitary construction;
said plurality of contact members including a plurality of engagement surfaces sized and shaped for engaging said plurality of contact pads, the plurality of contact members further including a conductive layer directly deposited on said plurality of engagement surfaces;
said plurality of engagement surfaces defining a surface substantially conformal with said curved surface;
said electronic component mounted on said mating component; and
said plurality of engagement surfaces being in surface-to-surface engagement with said plurality of contact pads.

29. The electronic assembly of claim 28 wherein said plurality of engagement surfaces is soldered to said plurality of contact pads.

30. The electronic assembly of claim 28 wherein said plurality of contact members are substantially free of residual stress.

31. The electronic assembly of claim 28 wherein said plurality of engagement surfaces conformal with said plurality of contact pads within a tolerance of about 0.25 millimeter.

32. The electronic assembly of claim 28 wherein said case and said plurality of contact members are molded from a liquid crystal polymer thermoplastic material.

* * * * *